(12) United States Patent
Gossner et al.

(10) Patent No.: US 9,577,079 B2
(45) Date of Patent: Feb. 21, 2017

(54) TUNNEL FIELD EFFECT TRANSISTORS

(75) Inventors: Harald Gossner, Riemerling (DE);
Ramgopal Rao, Mumbai (IN); Ram Asra, Mumbai (IN)

(73) Assignees: Infineon Technologies AG, Neubiberg (DE); Indian Institute of Technology Bombay, Mumbai (IN)

( * ) Notice: Subject to any disclaimer, the term of this patent is extended or adjusted under 35 U.S.C. 154(b) by 815 days.

(21) Appl. No.: 12/641,088

(22) Filed: Dec. 17, 2009

(65) Prior Publication Data

US 2011/0147838 A1  Jun. 23, 2011

(51) Int. Cl.
| | |
|---|---|
| *H01L 31/102* | (2006.01) |
| *H01L 29/739* | (2006.01) |
| *H01L 29/66* | (2006.01) |
| *H01L 21/265* | (2006.01) |
| *H01L 29/06* | (2006.01) |
| *H01L 29/165* | (2006.01) |

(52) U.S. Cl.
CPC ..... *H01L 29/7391* (2013.01); *H01L 29/66356* (2013.01); *H01L 21/26506* (2013.01); *H01L 21/26586* (2013.01); *H01L 29/0692* (2013.01); *H01L 29/165* (2013.01)

(58) Field of Classification Search
CPC ............... H01L 29/165; H01L 29/0895; H01L 29/66545; H01L 29/66356; H01L 29/66606; H01L 29/66871; H01L 29/7391
USPC .................. 257/E21.399, 458, 656, E31.061,257/E29.336, E33.046, 345, 346, 347, 348, 349
See application file for complete search history.

(56) References Cited

U.S. PATENT DOCUMENTS

| | | |
|---|---|---|
| 3,173,814 A | 3/1965 | Law |
| 3,694,705 A | 9/1972 | Wenzig |
| 3,731,119 A | 5/1973 | Matzen |
| 3,919,009 A | 11/1975 | Borchert et al. |
| 3,919,010 A | 11/1975 | Borchert et al. |
| 4,196,439 A | 4/1980 | Niehaus et al. |
| 4,422,089 A | 12/1983 | Vaes et al. |
| 4,593,458 A | 6/1986 | Adler |
| 5,489,792 A * | 2/1996 | Hu ................... H01L 29/42384 257/347 |

(Continued)

FOREIGN PATENT DOCUMENTS

| | | |
|---|---|---|
| DE | 10 2005 007 822 A1 | 8/2006 |
| WO | WO 2006/087044 A1 | 8/2006 |

OTHER PUBLICATIONS

Bhuwalka, K. K., et al., "Performance Enhancement of Vertical Tunnel Field-Effect Transistor with SiGe in the δ $p^+$Layer", Japanese Journal of Applied Physics, vol. 43, No. 7A, 2004, pp. 4073-4078.

(Continued)

*Primary Examiner* — David Chen
(74) *Attorney, Agent, or Firm* — Slater Matsil, LLP

(57) ABSTRACT

Tunnel field effect devices and methods of fabricating tunnel field effect devices are described. In one embodiment, the semiconductor device includes a first drain region of a first conductivity type disposed in a first region of a substrate, a first source region of a second conductivity type disposed in the substrate, the second conductivity type being opposite the first conductivity type, a first channel region electrically coupled between the first source region and the first drain region, the first source region underlying a least a portion of the first channel region, and a first gate stack overlying the first channel region.

38 Claims, 11 Drawing Sheets

(56) References Cited

U.S. PATENT DOCUMENTS

| | | | |
|---|---|---|---|
| 5,581,115 | A | 12/1996 | Grubisich et al. |
| 5,668,397 | A | 9/1997 | Davis et al. |
| 6,103,564 | A * | 8/2000 | Masuda ............... H01L 29/861 257/347 |
| 6,147,383 | A * | 11/2000 | Kuroda ............... H01L 29/1083 257/344 |
| 6,424,005 | B1 * | 7/2002 | Tsai .................. H01L 29/66689 257/283 |
| 6,429,482 | B1 * | 8/2002 | Culp .................. H01L 29/1083 257/335 |
| 6,518,152 | B2 | 2/2003 | Hshieh et al. |
| 6,544,854 | B1 * | 4/2003 | Puchner et al. ............. 438/308 |
| 6,558,984 | B2 | 5/2003 | Hshieh et al. |
| 6,600,195 | B1 * | 7/2003 | Nishida ............ H01L 21/26586 257/335 |
| 6,617,643 | B1 * | 9/2003 | Goodwin-Johansson .... 257/335 |
| 6,700,160 | B1 * | 3/2004 | Merchant ..................... 257/338 |
| 6,784,492 | B1 * | 8/2004 | Morishita ........... H01L 29/1033 257/345 |
| 7,268,032 | B2 | 9/2007 | Darwish et al. |
| 7,948,048 | B2 * | 5/2011 | Kuroda ............ H01L 27/14689 257/290 |
| 8,049,276 | B2 | 11/2011 | Yedinak et al. |
| 8,110,462 | B2 | 2/2012 | Steinhoff |
| 8,384,122 | B1 * | 2/2013 | Hu ..................... H01L 29/7391 257/104 |
| 2003/0190789 | A1 * | 10/2003 | Salama et al. ................ 438/286 |
| 2006/0113612 | A1 * | 6/2006 | Gopalakrishnan et al. ... 257/392 |
| 2006/0113627 | A1 * | 6/2006 | Chen et al. ................... 257/500 |
| 2006/0118776 | A1 * | 6/2006 | Tezuka et al. ................... 257/19 |
| 2006/0244068 | A1 * | 11/2006 | Desouza et al. .............. 257/351 |
| 2006/0258072 | A1 | 11/2006 | Kavalieros et al. |
| 2007/0267619 | A1 | 11/2007 | Nirschl |
| 2009/0101975 | A1 | 4/2009 | Holz et al. |
| 2010/0295058 | A1 * | 11/2010 | Cho ................................ 257/77 |

OTHER PUBLICATIONS

Born, M., et al., Tunnel FET: A CMOS Device for High Temperature Applications, Proc. 25$^{th}$ International Conference on Microelectronics (MIEL 2006), Belgrade, Serbia and Montenegro, May 14-17, 2006, 4 pages.

Fulde, M., et al., "Fabrication, Optimization and Application of Complementary Multiple-Gate Tunneling FETs", 2$^{nd}$ IEEE International Nanoelectronics Conference, 2008, Mar. 24-27, 2008, pp. 579-584.

Gopalakrishnan, K., et al., "I-MOS: A Novel Semiconductro Device wth a Subthreshold Slope lower than kT/q", International Electron Devices Meeting, 2002, pp. 289-292.

Hansch, W., et al., "A vertical MOS-gated Esaki tunneling transistor in silicon", Thin Solid Films 369 (2000), pp. 387-389.

Koswatta, S. O., et al., "Performance comparison between *p-i-n* tunneling transistors and conventional MOSFETs", IEEE Transactions on Electron Devices, vol. 56, Issue 3, Mar. 2009, pp. 1-37.

Luryi, S., et al., "Nonclassical devices in SOI: Genuine or copyright from III-V", Solid-State Electronics 51 (2007), pp. 212-218.

Nikam, V., et al., "Optimization of n-channel tunnel FET for the sub-22nm gate length regime", Device Research Conference, Jun. 23-25, 2008, pp. 77-78.

Nirschl, T., et al., "The Tunneling Field Effect Transistor (TFET): The Temperature Dependence, The Simulation Model, and its Application", Proc. of ISCAS, vol. 3, 2004, pp. 713-716.

Nirschl, T., et al., "The 65nm Tunneling Field Effect Transistor (TFET) 0.68 μm$^2$ 6T Memory Cell and Multi-V$_{th}$ Device", Proceedings of 35$^{th}$ European Solid-State Device Research Conference, Sep. 12-16, 2005, pp. 173-176.

Reddick, W.M., et al., "Silicon surface tunnel transistor", Appl. Phys. Lett., vol. 67, Issue 4, Jul. 24, 1995, pp. 494-496.

Toh, E.-H., et al., "Device physics and design of germanium tunneling field-effect transistor with source and drain engineering for low power and high performance applications", Journal of Applied Physics 103, 104504 (2008), 5 pages.

Verhulst, A.S., "Tunnel field-effect transistors for future low-power nano-electronics", 216$^{th}$ ECS Meeting, Vienna, Austria, Oct. 4-9, 2009, 1 page.

Verma, N., et al., "A 65nm 8T Sub-V, SRAM Employing Sense-Amplifier Redundancy", IEEE International Digest of Technical Papers, Solid-State Circuits Conference, 2007, 3 pages.

Wang, L.(D.), et al., "Design Considerations for Tunneling MOSFETs Based on Staggered Heterojunctions for Ultra-Low-Power Applications", 2009 IEEE Nanotechnology Materials and Devices Conference, Jun. 2-5, 2009, pp. 196-199.

Heigl, et al., "Optimization of Vertical Tunneling Field-Effect Transistors," Proceedings of ULIS, 2007, 4 pages.

Serway, et al., "Semiconductors," 36 pages.

* cited by examiner

TUNNEL FIELD EFFECT TRANSISTORS

TECHNICAL FIELD

The present invention relates generally to semiconductor devices and, in particular embodiments, to tunnel field effect transistors.

BACKGROUND

For almost four decades, the progress of microelectronics, as defined by Moore's Law, has been based on the constant optimization of cost-efficient materials, processes and technologies. For sub-100 nm technologies, conventional scaling has become challenging.

Scaling without a loss of performance requires scaling down source/drain regions and gate oxide thickness to maintain sufficient gate control. However, in practice, the pace of scaling both gate oxide and source/drain junctions has reduced. Gate oxide scaling has slowed down due to increased gate leakage, while source/drain junction scaling has been hampered due to increased resistance due to inability to increase dopant solubility. As a practical matter, this manifests as an increase in short channel effects such as drain induced barrier lowering. The loss of gate control and the increase in DIBL result in increased leakage currents in sub-100 nm MOS transistors.

The sub-threshold leakage can be suppressed with increased channel doping, but only with a significant penalty in on-current because of the substantial decrease in mobility due to the high doping levels required to isolate the source from the drain regions. Local strain silicon technologies were introduced to offset the performance loss. In such technologies, the channel or specifically, the inversion region, was strained so as to boost the mobility of the device during operation. This helped to offset the loss arising from the loss in mobility due to, for example, increased Coloumb scattering at high doping levels, which was needed to maintain leakage currents. Nevertheless, strain technologies do not scale with further shrinking geometries and importantly, electron mobilities saturate with strain.

A direct means to increase gate control without increasing gate tunneling leakage currents is to increase the gate dielectric permittivity. Thus, high-k dielectrics have also been introduced to improve gate control. However, even these may not be sufficient to ensure gate control beyond sub-30 nm technologies.

A direct consequence of the poor gate control is the high sub-threshold slope of these extremely scaled devices. A typical transistor requires at least a 10,000× difference between the off-current when the transistor is not activated and the on-current. Devices with high sub-threshold slope require much higher change in gate voltage to produce a required (~10,000) change in current through the transistor. Low power devices have more stringent requirements between the on- and off-current ratios. For example, a ratio of $10^7$ is desirable for low power devices with low leakage currents. Devices with sub-threshold slopes cannot satisfy these requirements for low power devices. For these devices, simply increasing the threshold voltage to improve (decrease) the off-current will result in very poor on-currents degrading the drive performance of the transistor. Hence, what are needed are devices with low sub-threshold slope that provide good on-current performance.

SUMMARY OF THE INVENTION

These and other problems are generally solved or circumvented, and technical advantages are generally achieved, by embodiments of the present invention.

In accordance with an embodiment of the present invention, a semiconductor device comprises a first drain region of a first conductivity type disposed in a first region of a substrate, a first source region of a second conductivity type disposed in said substrate, said second conductivity type being opposite said first conductivity type. The device further comprises a first channel region electrically coupled between said first source region and said first drain region, said first source region underlying at least a portion of said first channel region, and a first gate stack overlying said first channel region.

In accordance with another embodiment of the present invention, a method of forming a semiconductor device comprises forming a first source region of a first conductivity type in a substrate, forming a channel region contacting a top surface of the first source region, the channel region disposed over the substrate, and forming a gate stack over the channel region. The method further comprises forming a first drain region of a second conductivity type in the substrate, the first drain region being formed adjacent a first sidewall of the gate stack, the second conductivity being opposite to the first conductivity, and forming a first doped region of the second conductivity between the first source and drain regions.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

FIG. 3, which includes

FIG. 4, which includes

FIG. 5, which includes FIGS. 5A and 5B, illustrates an interdigitated TFET in accordance with an embodiment of the invention, wherein FIG. 5A illustrates a top view, and wherein FIG. 5B illustrates a cross-sectional view;

FIG. 6, which includes

FIG. 7, which includes

FIG. 9, which includes FIGS. 9A and 9B, illustrates a multiple gate TFET device in accordance with an embodiment of the invention, wherein FIG. 9A illustrates a top view wherein FIG. 9B illustrates a cross-sectional view;

FIG. 10, which includes

FIG. 11, which includes

DETAILED DESCRIPTION OF ILLUSTRATIVE EMBODIMENTS

The making and using of the embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Despite advances in conventional MOSFETS, voltage scaling is still very difficult if not already stopped. One of the main reasons is the fundamental limit to operate these transistors, which is also called sub-threshold swing. Sub-threshold swing determines the ability to turn off the transistor with a change in gate voltage ($V_{GS}$). Conventional MOSFETS are based on thermionic emission of carriers over a barrier (channel). As a consequence, the sub-threshold swing (S) has a fundamental limit of 2.3 $k_b$ T/q, where $k_b$ is the Boltzmann constant, T is the temperature, and q is the electron charge. At room temperature, the sub-threshold swing is about 60 mV/decade. In fact, real devices, which have non-ideal behavior due to poor DIBL, have much higher sub-threshold swing. A direct consequence of this limited scaling of the sub-threshold slope manifests as a non-scalability of power supply ($V_{DD}$) because a large $V_{DD}$ is required to generate a sufficient on-current.

Transistors based on band-to-band tunneling offer a means to lower sub-threshold swing. As a result, tunnel field effect transistor can offer small leakage currents compared to conventional MOSFETS. TFETs have a p-i-n diode in reverse polarity where the i-region is controlled by a gate. If the inversion channel is formed at the surface of the i-region, the band edges are bent in a way that strong band-to-band tunneling occurs. Because the tunneling mechanism is not governed by thermionic emission, sub-threshold swings much below the 60 mV/dec can be achieved. In fact, sub-threshold swings as low as 10 mV/dec are achievable with TFETs.

Compared to conventional MOSFETS, TFETs have poor on-currents, thus prohibiting their utility. A basic problem of TFET devices is that the tunneling occurs over a very small area resulting in a low on-current per device width. Typically, only a small region adjacent the source edge and underneath the gate forms the tunnel junction. Embodiments of the invention overcome these limitations by forming a gate controlled tunnel junction over a large area within the device. This increased area increases the on-current of the device.

A structural embodiment of the tunnel field effect transistor (TFET) will be described with respect to FIG. 1. Additional structural embodiments will be described with respect to FIGS. 2-5, and 8-9. Various methods of fabricating the semiconductor device in accordance with embodiments of the inventions will be described with respect to FIGS. 6, 7, 10 and 11.

Figure 1:
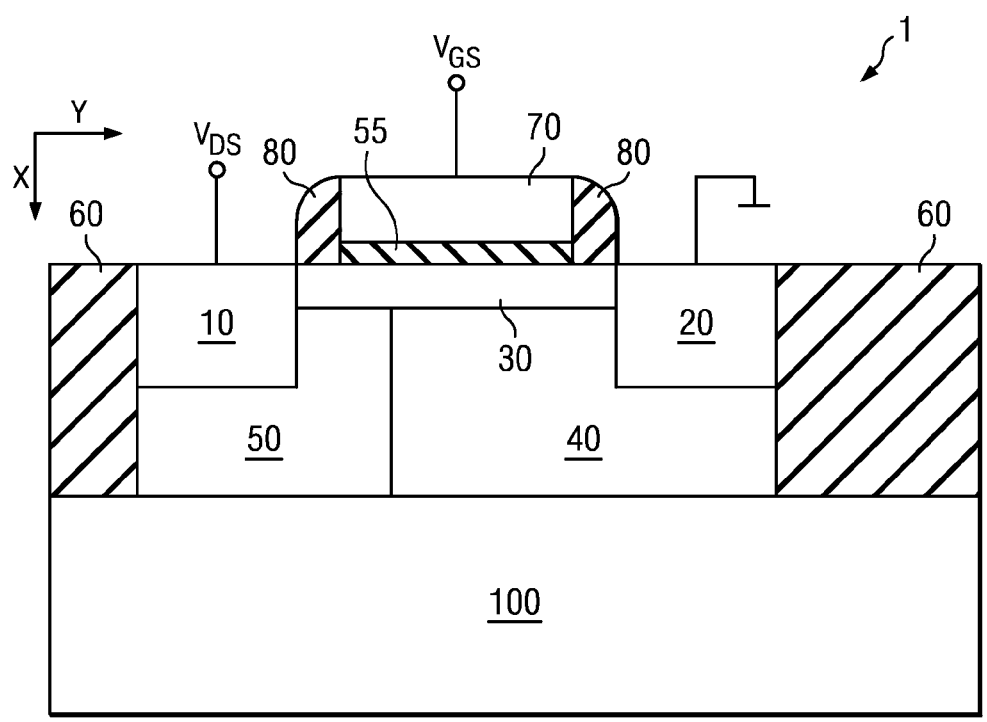
FIG. 1 is a structural embodiment of a tunnel field effect transistor in accordance with an embodiment of the invention.

FIG. 1 is a structural embodiment of a tunnel field effect transistor in accordance with an embodiment of the invention.

Referring to FIG. 1, a tunnel field effect transistor 1 is formed over a substrate 100. The substrate 100 is a silicon on insulator (SOI) substrate in one embodiment. In alternative embodiments, bulk silicon substrates may be used as the substrate 100. Isolation regions 60 are disposed over the substrate 100 as shown in FIG. 1. The isolation regions 60 comprise a suitable insulating material and include oxides, or an oxide lined with a nitride or an equivalent material. As an example, the isolation regions 60 comprise shallow trench isolation regions.

A first doped region 10 having a first conductivity type is disposed adjacent the isolation region 60. In one embodiment, the first conductivity type is an n-type conductivity, and, in one case, the first doped region 10 is a heavily doped n-type region. The first doped region 10 may be formed by doping a portion of the substrate 100 with an arsenic, antimony, and/or phosphorus atoms. In one embodiment, the first doped region 10 has a doping of at least $10^{19}$ cm$^{-3}$ and greater than $10^{20}$ cm$^{-3}$ in another embodiment.

A second doped region 20 having a second conductivity type is disposed adjacent another isolation region 60 as shown in FIG. 1. The second conductivity type is opposite to the first conductivity type. The second doped region 20 is doped heavily with a p-type doping. In one embodiment, the second doped region 20 may be formed by doping a portion of the substrate 100 with boron and/or indium atoms. In one embodiment, the second doped region 20 has a doping of at least $10^{19}$ cm$^{-3}$, and greater than $10^{20}$ cm$^{-3}$ in another embodiment.

A channel region 30 is disposed between the first and the second doped regions 10 and 20. In one embodiment, the channel region 30 comprises a material having a lower band gap than the semiconductor material of the substrate 100. If the substrate comprises silicon, then the channel region, in various embodiments, has a band gap less than that of silicon. In one embodiment, the channel region 30 comprises silicon germanium. In one embodiment, the channel region 30 comprises at least 15% germanium (mole fraction), and about 30% germanium (mole fraction) in one case. In other embodiments, the channel region 30 may comprise narrow band gap compound semiconductors having band gap less than silicon such as InSb, InAs, and the like.

In various embodiments, the channel region 30 comprises a lowly doped region. In one embodiment, the channel region 30 is intrinsic. Alternatively, the channel region, although lowly doped, is extrinsic having the first conductivity type. In various embodiments, the doping in the channel region 30 is less than $5 \times 10^{18}$ cm$^{-3}$, and in one embodiment less than $5 \times 10^{17}$ cm$^{-3}$. The channel region 30 is a thin layer of about 1 nm to about 10 nm in various embodiments, and about 2 nm to about 4 nm in one embodiment.

A gate dielectric 55 is disposed over the channel region 30. In one embodiment, the gate dielectric 55 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material may be used as a gate dielectric 55.

A gate electrode 70 is disposed over the channel region 30 and the gate dielectric 55. The gate electrode 70 is a conductive material and comprises a doped polysilicon layer and/or a metal. In various embodiments, the gate electrode 70 may comprise TiN, TiC, HfN, TaN, TaC, W, Al, Ru, RuTa, TaSiN, NiSi$_x$, CoSi$_x$, TiSi$_x$, Ir, Y, YbSi$_x$, ErSi$_x$, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW. In one embodiment, the gate electrode 70 comprises a doped polysilicon layer overlying a metal layer such as a TiN layer.

A spacer 80 is disposed adjacent the gate electrode 70. The spacer 80 may be a single layer or may comprise a plurality of layers of different materials. In one embodiment, the spacer 80 comprises an oxide layer. In another embodiment, the spacer 80 comprises at least one oxide and one nitride layer.

A low doped region 50 is disposed under and adjacent the first doped region 10. The low doped region 50 is disposed under a portion of the channel region 30 and under a portion of the gate electrode 70. In various embodiments, the low doped region 50 comprises the same conductivity as the first doped region 10. Alternatively, the low doped region 50 comprises the same conductivity as the second doped region 20. However, the low doped region 50 has a lower doping than the first doped region 10. In one embodiment, the low doped region 50 comprises a doping of about $10^{18}$ cm$^{-3}$ to about $5 \times 10^{19}$ cm$^{-3}$.

A heavily doped region 40 is disposed under a remaining portion of the channel region 30. As illustrated in FIG. 1, the heavily doped region 40 is adjacent the low doped region 50. The heavily doped region 40 comprises the same conductivity as the second doped region 20. As a consequence, the heavily doped region 40 and the low doped region 50 have opposite doping types.

The first doped region 10 is coupled to a first potential node (drain voltage $V_{DS}$), whereas the second doped region 20 is coupled to a second potential node (grounded in one embodiment). The gate electrode 70 is coupled to a gate potential node ($V_{GS}$).

The tunnel junction of the n-channel TFET is activated when the first potential node is coupled to a positive potential, and the second doped region 20 is coupled to ground or a negative potential, and the gate potential node is coupled to a positive potential. As gate potential node ($V_{GS}$) is increased positively at the on state (first potential node is at high), an inversion region is formed in the channel region 30. Valence band electrons from the second doped region 20 and the heavily doped region 40 tunnel into the conduction band of the channel region 30 and are swept into the first doped region 10 producing the on-current of the device.

The total on-current through the TFET depends on the area through which tunneling occurs, and the magnitude of the tunnel current at each point in the tunnel junction. In various embodiments, at least two distinct interfaces form a tunnel junction. A first interface between the second doped region 20 and the channel region 30 and a second interface between the heavily doped region 40 and the channel region 30 form a tunnel junction. In various embodiments, the magnitude of the tunnel current through each of the tunnel junction is controlled to maximize tunneling between the heavily doped region 40 and the channel region 30.

The tunnel current at each point along the tunnel junction depends on the electric field at the junction, and the difference in the energy band gap $E_g$ between the second doped region 20, which is the source, and the channel region 30. A commonly used empirical relationship that describes the tunnel current $I_{TJ}$ through a reverse biased diode as in the TFET is defined as $$I_{TJ} = \frac{A\epsilon^2}{E_g^{\frac{1}{2}}} \exp\left(-B\frac{E_g^{3/2}}{\epsilon}\right),$$

where A and B are constants for a given material, and $E_g$ is the band gap of the material through which tunneling occurs. Thus, applied voltages (amount of reverse biasing forming the tunnel junction), and doping, which determine the electric field ($\in$) impact the tunnel current. As a consequence, for a fixed device geometry, the tunnel current $I_{TJ}$ is maximized by having abrupt junctions between the second doped region 20 and the channel region 30, and between the heavily doped region 40 and the channel region 30.

In various embodiments, the net doping concentration varies abruptly at the junction between the heavily doped region 40 and the channel region 30 and between the second doped region 20 and the channel region 30. In one embodiment, the second doped region 20 and the channel region 30 form a junction with a net doping having an abruptness less than 5 nm/dec (i.e. the net doping profile decays 1 decade in concentration, e.g., from $10^{19}$ cm$^{-3}$ to $10^{18}$ cm$^{-3}$ over 5 nm depth), and less than 3 nm/dec in one embodiment. In another embodiment, the heavily doped region 40 and the channel region 30 form a junction with a net doping having an abruptness less than 5 nm/dec, and less than 3 nm/dec in one embodiment.

In one embodiment, the channel region 30 is doped with the first conductivity type dopant to a first concentration level. The channel region 30 is counter-doped with the second conductivity type to achieve a much lower net doping. In various embodiments, this is done to ensure an abrupt junction at the tunnel junction between the heavily doped region 40 and the channel region 30 and between the second doped region 20 and the channel region 30. The doping from the heavily doped region 40 and/or the second doped region 20 can decay into the channel region 30 and compensate the doping in the channel region thereby reducing the net doping from the first concentration level to a lower level. Advantageously, the abruptness of the net doping profile also improves using such a counter doping.

As noted above, in various embodiments, the material at the tunnel junction is selected to maximize the constants B and reduce band gap factor $E_g$. In one embodiment, the band gap is modified or tailored using strain. Strain modifies not only the band gap but also the effective mass of the carriers (which modifies the material constant B). For example, compressive uniaxial strain along a <100> direction applied on a (100) silicon substrate decreases the effective mass of holes, thus reducing the constant B. A reduction in B will increase the tunneling rate. Similarly, vertical compressive strain (or biaxial strain along the plane of transport) induces or adds to splitting of the sub-bands of the conduction band minimum resulting in an increase in occupation of the sub-bands with lower effective mass. Strain may also be used to improve channel mobilities of the transistors. In various embodiments, the direction and level of strain is selected to optimize the increase in channel mobility and the tunnel current between the heavily doped region 40 and the channel region 30, which is perpendicular to the current flow in the inversion layer of the channel region 30. The strain may be added in various embodiments using stress liners, germanium implantation, stress memorization, and/or embedded epitaxial source or drain regions.

In an alternative embodiment, the substrate 100 is chosen to reduce the effective carrier mass at the tunnel junctions. As described above, the tunnel current depends on the material constants (effective carrier mass), which depend on the crystal structure at the tunnel junction. In one embodiment, the heavily doped region 40 comprises a crystal orientation that is chosen to increase the tunnel current at the junction. In one case, the heavily doped region 40 comprises a different crystal orientation (or different crystal surface) than the bulk substrate 100, thereby increasing the tunnel current. In one case, the heavily doped region 40 comprises a (110) surface while the substrate 100 comprises a (100) surface. Alternatively, the substrate 100 itself has a (110) surface rather than the conventional (100) surface, thereby forming a heavily doped region 40 having a (110) surface.

Figure 12:
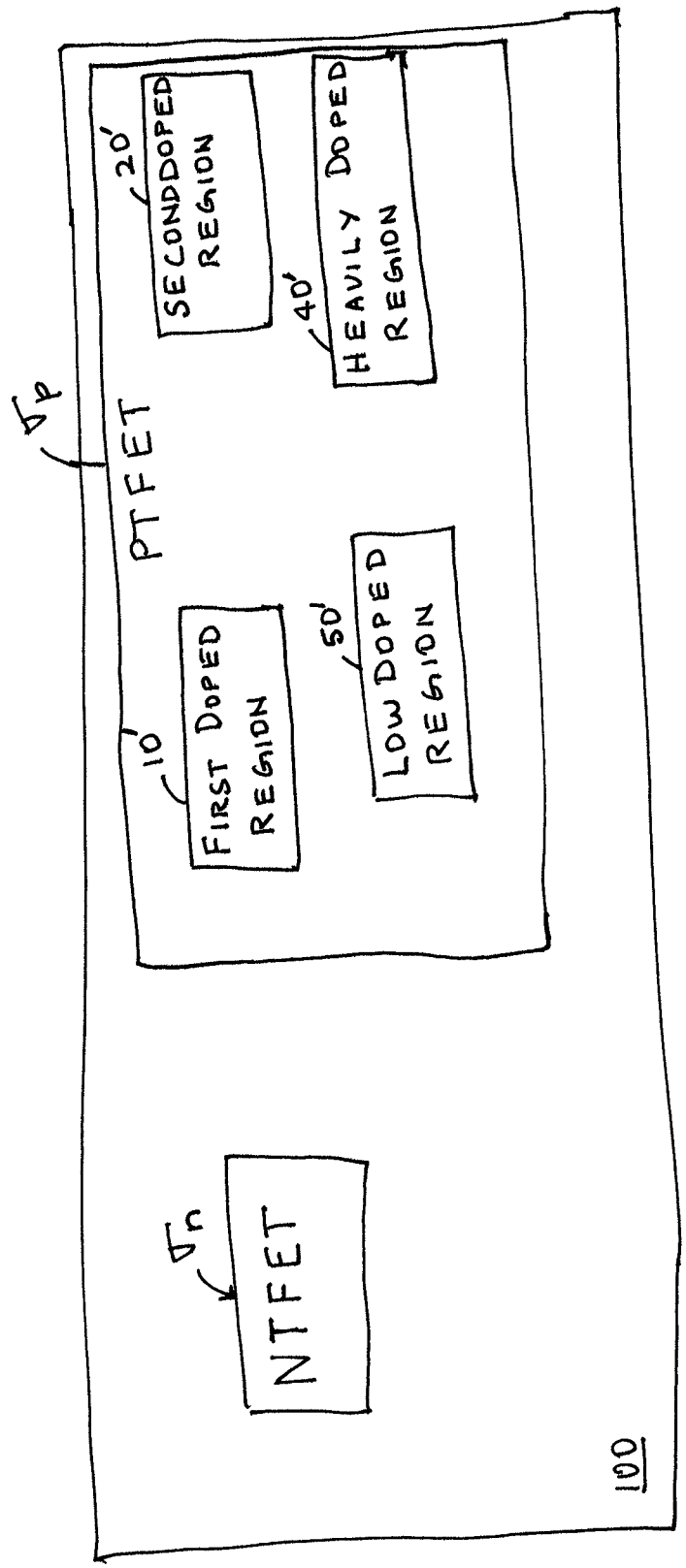
FIG. 12 is a structural embodiment of a semiconductor device comprising n-channel and p-channel tunnel field effect transistors in accordance with an embodiment of the invention.

As illustrated in FIG. 12, various embodiments of the invention include both n-channel and p-channel TFETs. The above embodiment, so far, was described for an n-channel TFET. For a p-channel TFET, all the doping is reversed. Accordingly, in a p-channel TFET, the first conductivity type is p-type, and the second conductivity type is n-type. Accordingly, the first doped region 10' (drain) has a $p^+$ doping, and the second doped region 20' (source) has an $n^+$ conductivity type. Similarly, in a p-channel TFET, the lowly doped region 50' has a p-type doping, and the heavily doped region 40' has an n-type doping. In one embodiment, p-channel TFETs are strained to improve the tunnel current. In another embodiment, the p-channel TFETs are strained to improve the tunnel current, while the n-channel TFETs are not strained. Alternatively, both n-channel and p-channel TFETs are strained to different extents, e.g., $\sigma_n$ and $\sigma_p$, to maximize both the on-currents in both devices.

Embodiments of the invention include CMOS devices formed using p-channel and n-channel TFETs. In one embodiment, the drain of an n-channel TFET (e.g., the first conductivity is n-type so that the first doped region 10 is doped n-type) is coupled to a conventional PMOS transistor forming a complimentary inverter similar to a CMOS circuit. Similarly, in another embodiment, the drain of a p-channel TFET (e.g., the first doped region 10) is coupled to a conventional NMOS transistor forming a complimentary inverter. Alternatively, a p-channel TFET may be combined with an n-channel TFET forming a complimentary TFET inverter (CTFET).

In one or more embodiments, the heavily doped region 40 may underlie at least a portion of the channel region 30. In one or more embodiments, the heavily doped region 40 may underlie at least 10% of the bottom surface of the channel region 30. In one or more embodiments, the heavily doped region 40 may underlie at least 25% of the bottom surface of the channel region 30. In one or more embodiments, the heavily doped region 40 may underlie at least 50% of the bottom surface of the channel region 30. In one or more embodiments, the heavily doped region 40 may underlie at least 75% of the bottom surface of the channel region 30. In one or more embodiments, the heavily doped region 40 may underlie substantially all of the bottom surface of the channel region 30.

However, unlike a vertical transistor, in various embodiments, an inversion layer formed under the gate dielectric 55 is oriented in a lateral direction. In particular, the current flow in the inversion layer is in the lateral direction, while the current flow across the tunnel junction can be along the lateral or vertical direction.

In one or more embodiments the heavily doped region 40 and the first doped region 10 may be spaced apart but parallel to a top surface of the substrate 100 (or parallel to the inversion layer formed under the gate dielectric 55). In one or more embodiments, the heavily doped region 40 and the first doped region 10 may be spaced apart in a lateral direction.

In one or more embodiments, the channel region 30 has a first dimension greater than a second dimension where the first dimension is parallel to the substrate 100 (parallel to the current flow in the inversion layer) and the second dimension is perpendicular to the substrate 100. In one or more embodiments, the channel region has a lateral dimension which is greater than a vertical dimension.

Figure 2A:
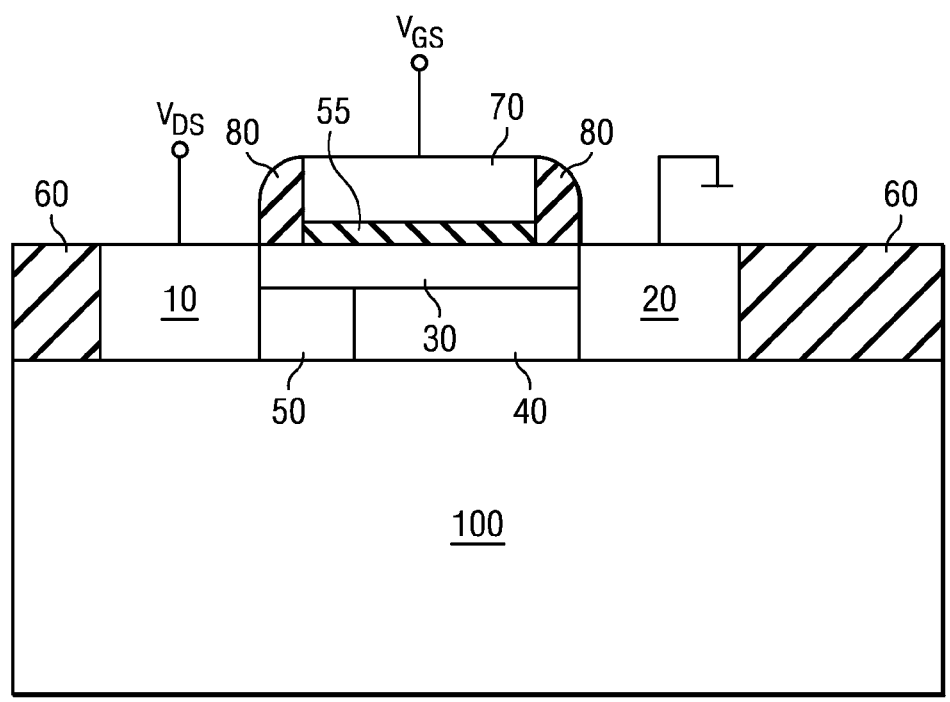
FIGS. 2A and 2B, illustrates structural embodiments of a TFET in accordance with embodiments of the invention.
Figure 2B:
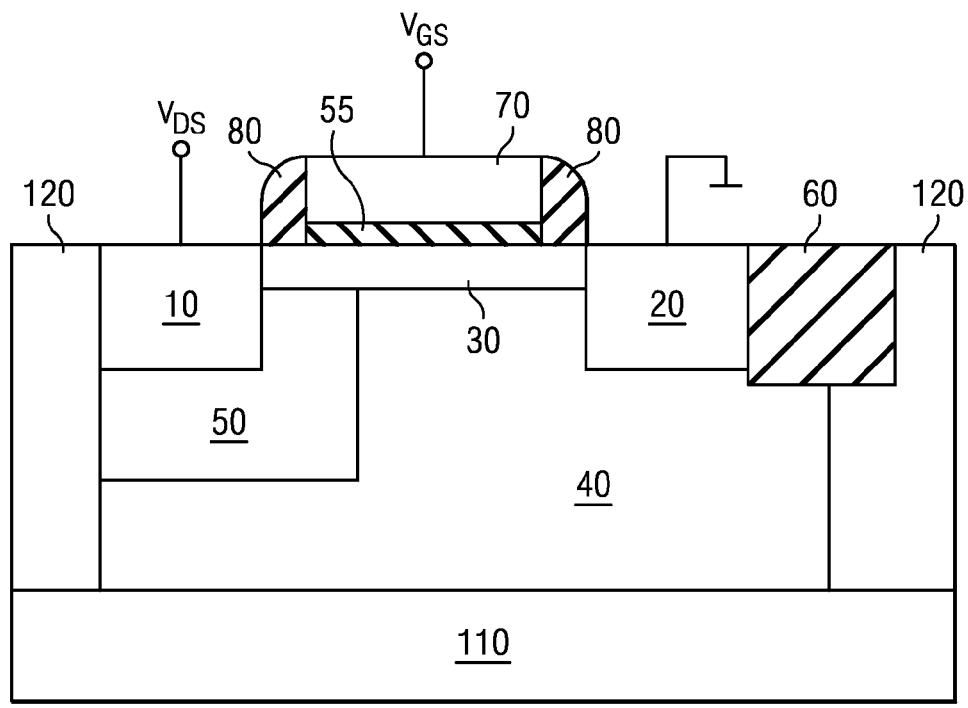

FIG. 2, which includes FIGS. 2A and 2B, illustrates structural embodiments of a TFET in accordance with embodiments of the invention.

FIG. 2A illustrates an embodiment, wherein the substrate 100 is disposed directly adjacent the first and the second doped regions 10 and 20. For example, the first and the second doped regions 10 and 20 may contact a buried oxide layer of the substrate 100. Referring to FIG. 2A, the first doped region 10 may extend up to the substrate 100 such that the low doped region 50 is only adjacent laterally. Similarly, the second doped region 20 may extend up to the substrate 100 such that the heavily doped region 40 contacts the second doped region 20 only laterally under the channel region 30.

FIG. 2B illustrates a TFET formed on a triple well technology. As described in the embodiment of FIG. 1, the TFET can be either a p-channel or n-channel device. However, unlike the prior embodiment, the TFET is formed over a well region 110. For an n-channel TFET, the well region 110 is doped as an n-region, whereas for a p-channel TFET, the well region 110 is doped as p-type conductivity.

The TFET is isolated by third doped region 120 having a first conductivity type. The third doped region 120 is a low doped region. A first doped region 10 having a first conductivity type is disposed adjacent the third doped region 120. Similarly, the second doped region 20 having a second conductivity is disposed adjacent the third doped region 120 and separated from it by an isolation region 60. The formation of the tunnel junction is similar to the device described in FIG. 1.

Figure 3A:
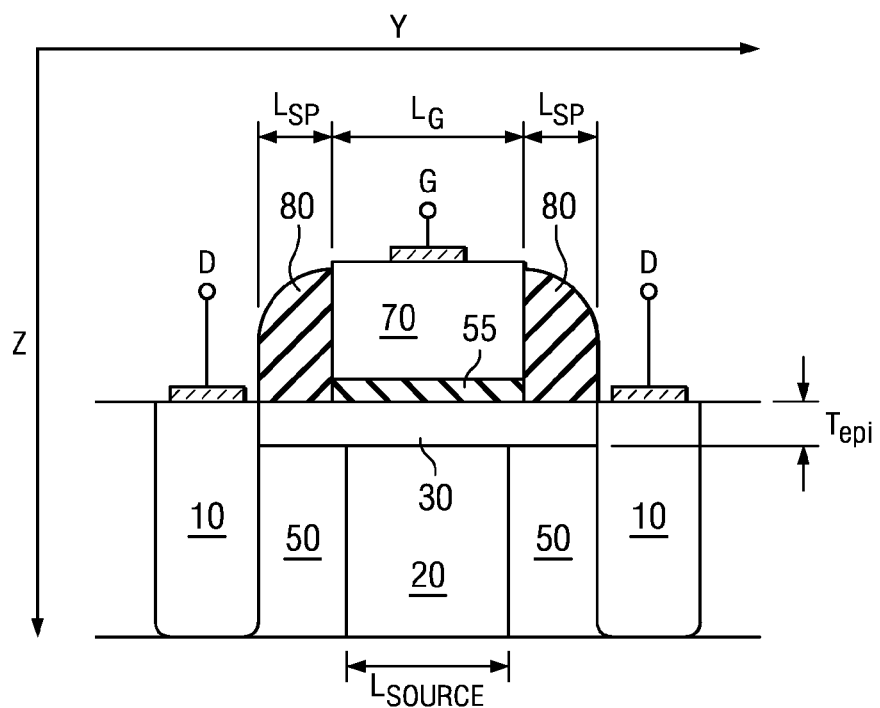
FIGS. 3A and 3B, illustrates an embodiment of the invention of a double drain TFET (DDTFET)
Figure 3B:
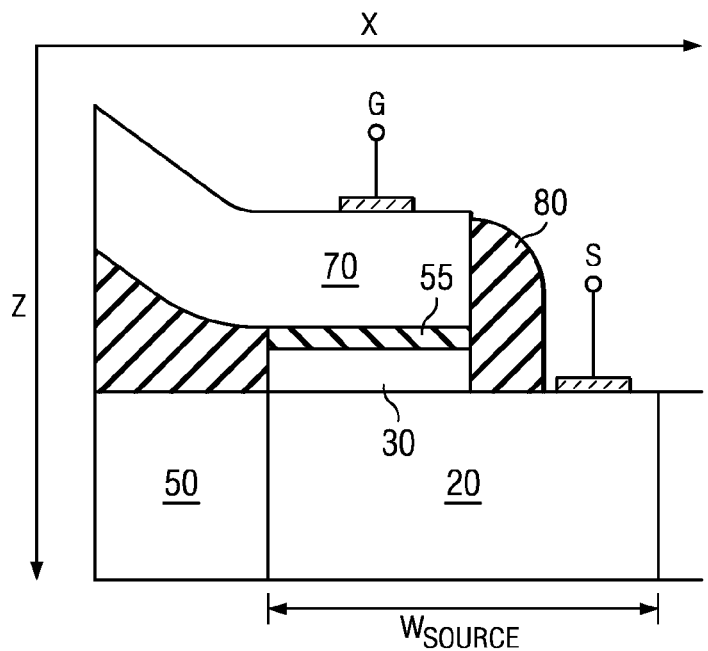

FIG. 3, which includes FIGS. 3A and 3B, illustrates an embodiment of the invention of a double drain TFET (DDTFET).

Referring to FIG. 3A, the first doped region 10 having a doping of the first conductivity and described with respect to FIG. 1 is disposed on both sides of the TFET. The second doped region 20 having the second conductivity type is disposed under the channel region 30. As a consequence, a tunnel junction is produced between the channel region 30 and the second doped region 20 over the length of the source region $L_{SOURCE}$. The lowly doped region 50 having the first conductivity type is disposed between the first and the second doped regions 10 and 20. FIG. 3B illustrates the device shown in FIG. 3A along the width of the device. The source region is contacted along the width as shown in FIG. 3B.

Figure 4A:
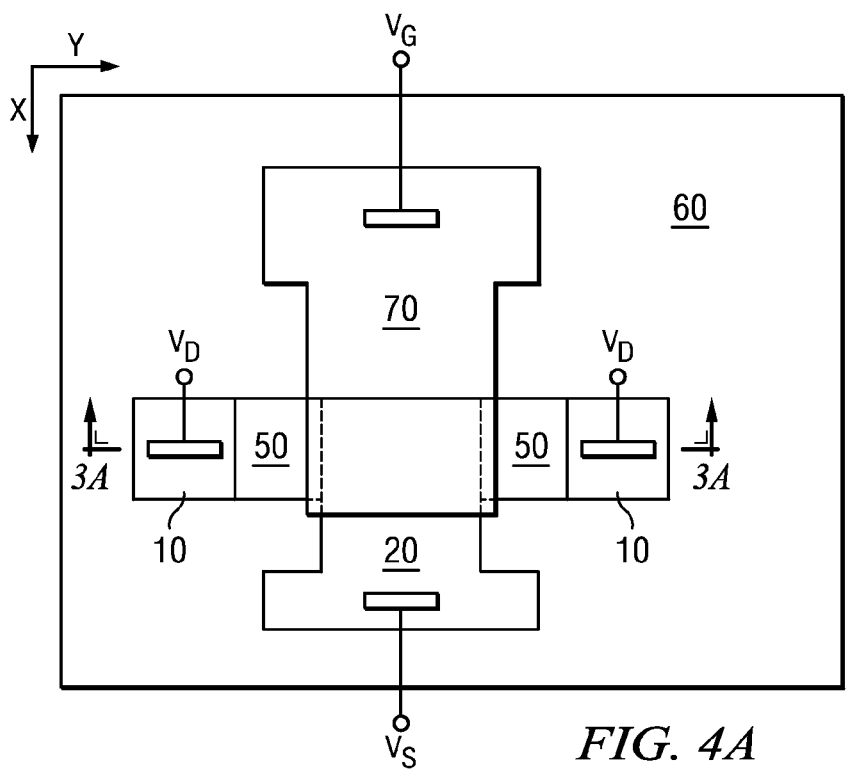
FIGS. 4A and 4B, illustrates a top view of an isolated TFET in accordance with an embodiment of the invention.
Figure 4B:
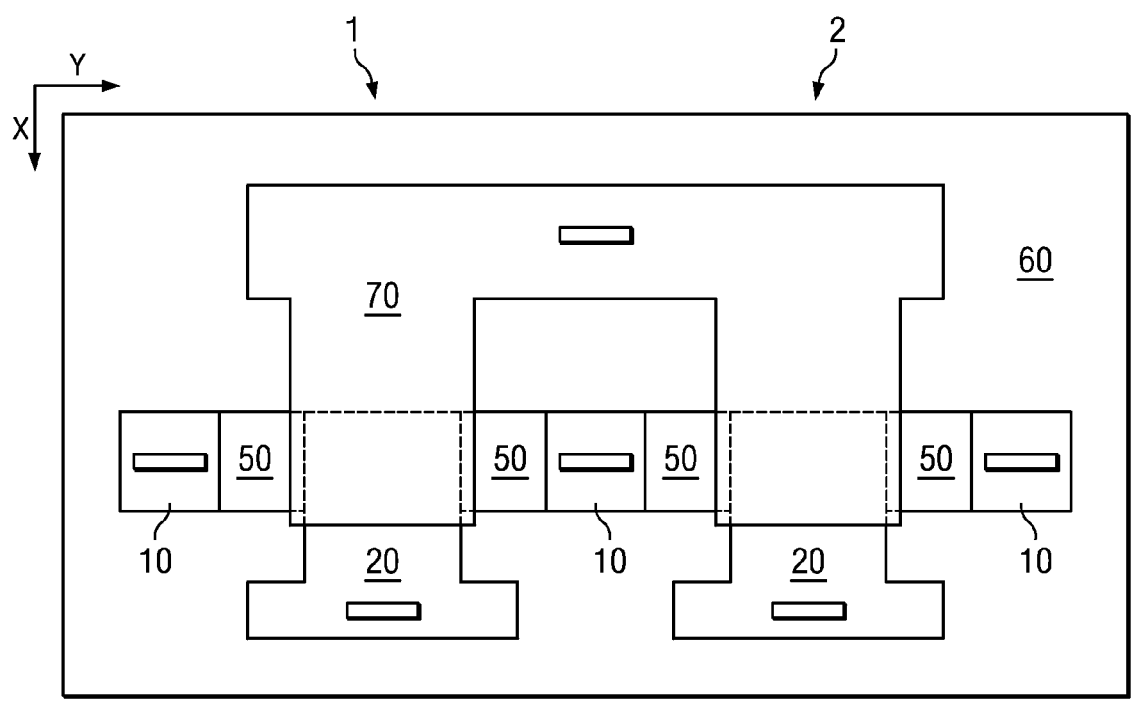

FIG. 4, which includes FIGS. 4A and 4B, illustrates a top view of an isolated TFET in accordance with an embodiment of the invention.

Referring to FIG. 4A, isolation regions 60 are disposed in a substrate and active areas are formed within the isolation regions 60. The active areas form the TFET and have two drain regions (first doped regions 10) coupled to a drain voltage $V_D$, and a source region (second doped region 20) coupled to a source voltage $V_S$. A gate line forms the gate electrode 70 and coupled to a gate voltage $V_G$. As illustrated in FIG. 4A, the second doped region 20 extends under the gate electrode 70 and between the two first doped regions 10. A lowly doped region 50 is disposed between the first and the second doped regions 10 and 20 and disposed underneath a channel region (not shown). The cross-sectional view of the TFET along the line 3A is similar to that described with respect to FIG. 3A.

FIG. 4B illustrates an alternative embodiment wherein the gate electrode turns around and forms a second TFET 2 adjacent a first TFET 1. The first and the second TFET 1 and 2 are coupled together having a common drain region. While only two TFETs are shown, in various embodiments a plurality of such finger like TFETs can be formed.

Figure 5A:
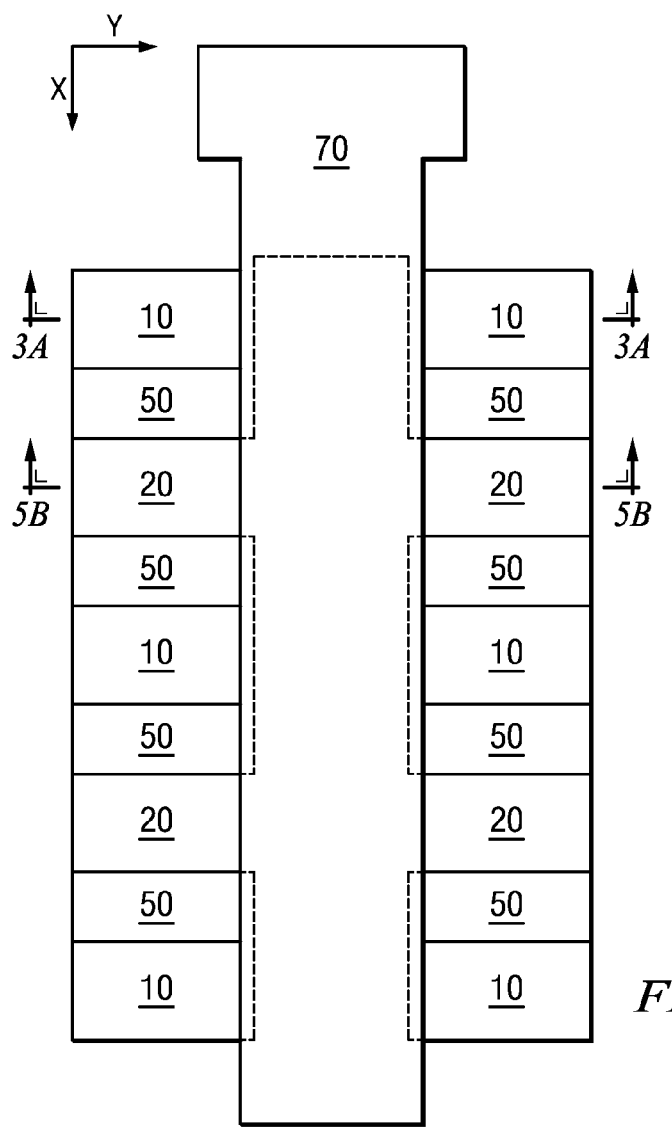
Figure 5B:
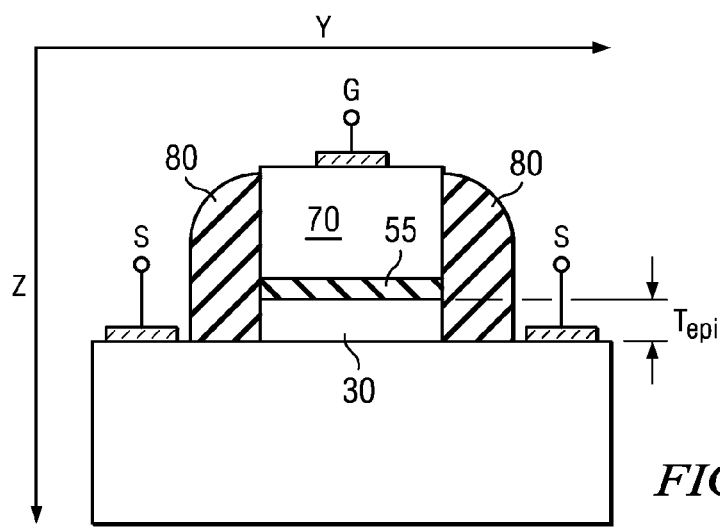

FIG. 5, which includes FIGS. 5A and 5B, illustrates an inter-digitated TFET in accordance with an embodiment of the invention, wherein FIG. 5A illustrates a top view, and wherein FIG. 5B illustrates a cross-sectional view.

A single gate line including the gate electrode 70 is disposed over a substrate. First and second doped regions 10 and 20 are arranged in rows separated by lowly doped region 50. The cross-sectional view of the TFET at the tunnel junction (e.g., along line 3A) is as described in FIG. 3A. The cross-sectional view along line 5B is shown in FIG. 5B. Since the device of FIG. 3A is a double drain TFET having a source under the gate line, in this embodiment, contacts to the source are made periodically as illustrated in the top view of FIG. 5A.

FIG. 6, which includes FIGS. 6A-6D, illustrates an embodiment of a method of manufacturing a semiconductor device having a TFET.

Figure 6A:
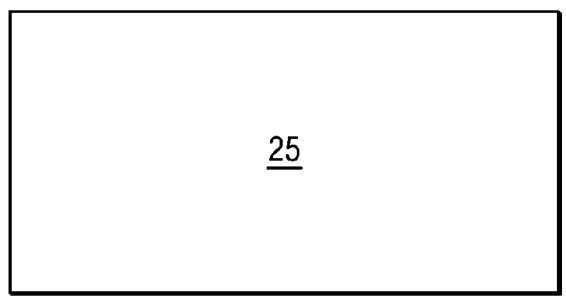
FIGS. 6A-6D, illustrates an embodiment of a method of manufacturing a semiconductor device having a TFET.

Referring to FIG. 6A, a semiconductor body 25 is provided. In the one embodiment, the semiconductor body 25 is a silicon wafer. Some examples of the semiconductor body 25 are a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer.

In various embodiments, the semiconductor body 25 is doped. For forming a p-channel TFET, the semiconductor body 25 is doped with an n-type doping. For example, the semiconductor body 25 is doped with phosphorus or arsenic to a doping of about $10^{18}$ cm$^{-3}$ to about $10^{19}$ cm$^{-3}$. Alternatively, for forming an n-channel TFET, the semiconductor body 25 is doped with a p-type doping. For example, the semiconductor body 25 is doped with boron to a doping of about $10^{18}$ cm$^{-3}$ to about $10^{19}$ cm$^{-3}$. The semiconductor body 25 is also doped with diffusion inhibiting impurities such as carbon, fluorine, and nitrogen in various embodiments.

Figure 6B:
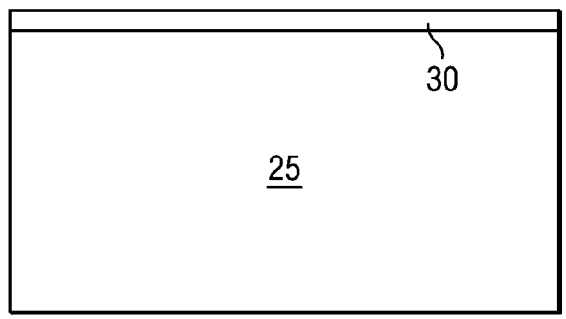

Referring to FIG. 6B, an epitaxial layer is grown on the semiconductor body 25 forming a channel region 30. The epitaxial layer can be grown through a suitable process such as chemical vapor deposition, molecular beam epitaxy, and the like. The channel region 30 is a thin layer of about 1 nm to about 10 nm in various embodiments, and about 2 nm to about 4 nm in one embodiment. In some embodiments, the channel region 30 may be implanted with a dopant of the first conductivity type. Alternatively, the channel region 30 may be in-situ doped during the epitaxial growth process.

The epitaxial layer may include germanium to reduce the band gap of the channel region 30. The epitaxial layer may include other compound semiconductor materials. Examples include InSb, InAr, InP, etc. Additionally, the epitaxial layer may include impurities such as carbon, fluorine, or the like to inhibit dopant diffusion.

Figure 6C:
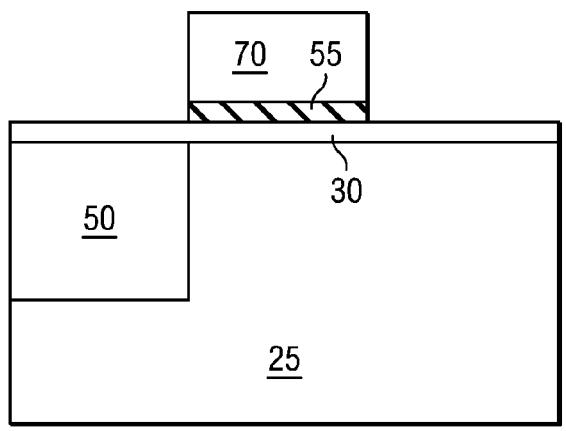

A gate stack is formed over the channel region 30 as illustrated in FIG. 6C. A gate dielectric 55 is deposited over exposed portions of the channel region 30. In one embodiment, the gate dielectric 55 comprises an oxide (e.g., SiO$_2$), a nitride (e.g., Si$_3$N$_4$), or a combination of oxide and nitride (e.g., SiON, or an oxide-nitride-oxide sequence). In other embodiments, a high-k dielectric material having a dielectric constant of about 5.0 or greater is used as the gate dielectric 55. The gate dielectric 55 may comprise a single layer of material, or alternatively, the gate dielectric 55 may comprise two or more layers.

The gate dielectric 55 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 55 may be deposited using other suitable deposition, or thermal growth techniques. The gate dielectric 55 comprises a thickness of about 10 Å to about 60 Å in one embodiment, although alternatively, the gate dielectric 55 may comprise other dimensions. While in some embodiments both n-channel and p-channel TFETs may have the same gate electric; in alternate embodiments, p-channel and n-channel TFETs could each have different gate dielectric material.

The gate electrode 70 is formed over the gate dielectric 55 by patterning and etching a gate layer formed on the gate dielectric 55. The gate electrode 70 comprises a semiconductor material, such as polysilicon or amorphous silicon in one embodiment, although alternatively, metals such as TiN may be used for the gate electrode 70. The gate electrode 70 having a thickness of between about 400 Å to 2000 Å may be deposited using CVD, PVD, ALD, or other deposition techniques.

Using a mask formed using conventional lithography techniques, only one side of the semiconductor body 25 adjacent the gate electrode 70 is opened. A drain implant is performed to add dopants into the semiconductor body 25. The drain implant introduces dopants of a first conductivity type. The drain implants are chosen so as to form a low doped region 50 of about 80 to 200 nm, and about 100 nm in one embodiment. In various embodiments, for forming an n-channel TFET, phosphorus, arsenic, and/or antinomy atoms are implanted. In one embodiment, phosphorus atoms are implanted at about 15 keV to 50 keV at a dose of about $10^{13}$ cm$^{-2}$ to about $5\times10^{14}$ cm$^{-2}$. Alternatively, in another embodiment, arsenic atoms at an energy of about 30 keV to about 60 keV are implanted into the semiconductor body 25 at a dose of about $10^{13}$ cm$^{-2}$ to about $5\times10^{14}$ cm$^{-2}$. In various embodiments, for forming a p-channel TFET, boron atoms are implanted. In one embodiment, boron atoms are implanted at about 10 keV to 50 keV at a dose of about $10^{13}$ cm$^{-2}$ to about $5\times10^{14}$ cm$^{-2}$. An optional anneal is performed after the implantation to remove the damage from the implantation.

Figure 6D:
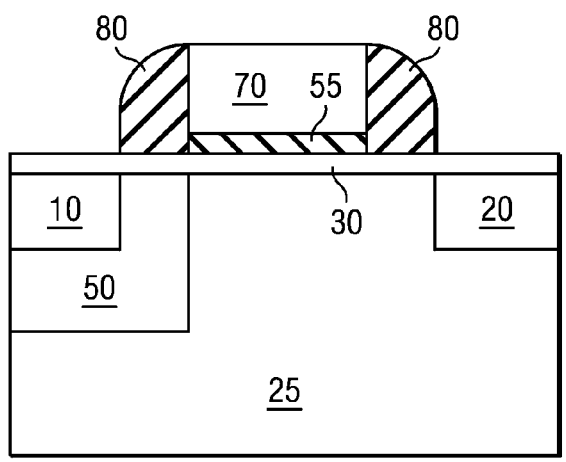

Referring to FIG. 6D, spacer 80 are formed adjacent to the gate electrode 70. The spacers 80 are formed from an insulating material such as an oxide and/or a nitride. The spacers 80 are typically formed by the deposition of a conformal layer followed by an anisotropic etch. The process can be repeated for multiple layers, as desired. In some cases, if the gate electrode 70 is polysilicon, at least a first layer of the spacers 80 may be formed by poly oxidation.

After forming the spacers 80, the source and drain regions of the TFET are formed. A first part of the semiconductor body 25 (either left or right of the gate electrode 70) is blocked and implanted. For example, a region on the left side of the gate electrode 70 is implanted to form the first doped region 10. In one embodiment, for forming n-channel TFET, phosphorus atoms are implanted at about 2 keV to 10 keV at a dose of about $10^{14}$ cm$^{-2}$ to about $5\times10^{15}$ cm$^{-2}$.

Alternatively, in another embodiment, arsenic atoms at an energy of about 2 keV to about 10 keV are implanted into the semiconductor body 25 at a dose of about $10^{14}$ cm$^{-2}$ to about $5\times10^{15}$ cm$^{-2}$. In an alternative embodiment, for forming a p-channel TFET, boron atoms are implanted at an energy of about 500 eV to about 5 keV at a dose of about $10^{14}$ cm$^{-2}$ to about $5 \times 10^{15}$ cm$^{-2}$. Alternatively, BF$_2$ may be used as the source for introducing boron atoms.

After blocking the first doped region 10, a second region on the right side of the gate electrode 70 is implanted to form the second doped region 20. The first and the second doped regions 10 and 20 may be implanted in reverse sequence. In one embodiment, for forming the source region of an n-channel TFET, boron atoms are implanted at an energy of about 500 eV to about 5 keV at a dose of about $10^{14}$ cm$^{-2}$ to about $5 \times 10^{15}$ cm$^{-2}$. Alternatively, BF$_2$ may be used as the source for introducing boron atoms. In an alternative embodiment, for forming the source region of a p-channel TFET, phosphorus atoms are implanted at about 2 keV to 10 keV at a dose of about $10^{14}$ cm$^{-2}$ to about $5 \times 10^{15}$ cm$^{-2}$. Alternatively, in another embodiment, arsenic atoms at an energy of about 2 keV to about 10 keV are implanted into the semiconductor body 25 at a dose of about $10^{14}$ cm$^{-2}$ to about $5 \times 10^{15}$ cm$^{-2}$.

A source/drain anneal follows the implantations. This is done to remove the implantation damage and form the junctions. In various embodiments, this anneal step is performed at a temperature between about 700° C. and about 1200° C., for a time between about 0.1 ms and about 1 s. For example, a rapid thermal anneal (RTA) can be performed at a temperature of 1090° C. for 0.1 s.

In some embodiments, the first or the second doped regions 10 or 20 may be formed using an epitaxial process. For example, a recess is formed in the semiconductor body 25 and an epitaxial semiconductor is grown from within the recess. This allows strain to the channel region 30 and the tunnel junction between the channel region 30 and the second doped region 20 or the tunnel junction between the channel region 30 and the heavily doped region 40 so as to increase the tunneling current. Alternatively, a stress liner may be formed over the semiconductor body 25 and the gate electrode 70 to introduce further strain into the channel region 30 and the tunnel junctions.

Further processing proceeds as in a conventional semiconductor fabrication process. For example, silicide regions are formed on the first and the second doped regions 10 and 20 and source and drain contacts may be formed. Similarly, the gate electrode 70 is contacted.

FIG. 7, which includes FIGS. 7A-7D, illustrates various stages of fabricating a TFET in accordance with an embodiment of the invention.

Figure 7A:
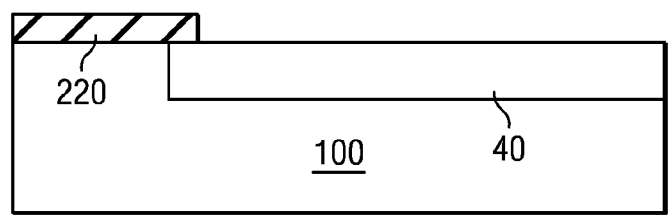
FIGS. 7A-7D, illustrates various stages of fabricating a TFET in accordance with an embodiment of the invention.

Referring to FIG. 7A, a first mask layer 220 is deposited and patterned using lithography on a substrate 100. The substrate 100 is doped to be an n-type for an n-channel TFET or a p-type for a p-channel TFET. The doping in the substrate 100 comprises about $10^{16}$ cm$^{-3}$ to about $10^{18}$ cm$^{-3}$.

A heavily doped region 40 is formed in the area opened with the first mask layer 220. The heavily doped region 40 is formed to be a p-type region if the TFET is an n-channel TFET. Otherwise, the heavily doped region comprises an n-type doping. The heavily doped region 40 comprises a doping of about $10^{18}$ cm$^{-3}$ to about $10^{20}$ cm$^{-3}$.

Figure 7B:
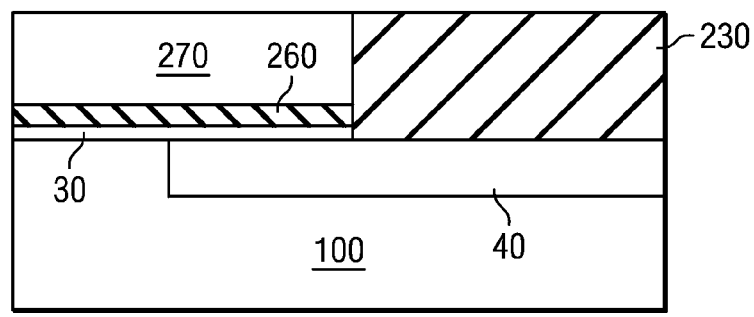

The first mask layer 220 is etched and removed and a second mask layer 230 is deposited over the substrate 100 as illustrated in FIG. 7B. A channel region 30 is epitaxially grown on the exposed substrate 100 not covered by the second mask layer 230. The channel region 30 includes germanium or other materials for narrowing the band gap of the channel region 30. A gate dielectric layer 260 and a gate layer 270 are formed over the channel region 30, for example, deposited as described in prior embodiments.

Figure 7C:
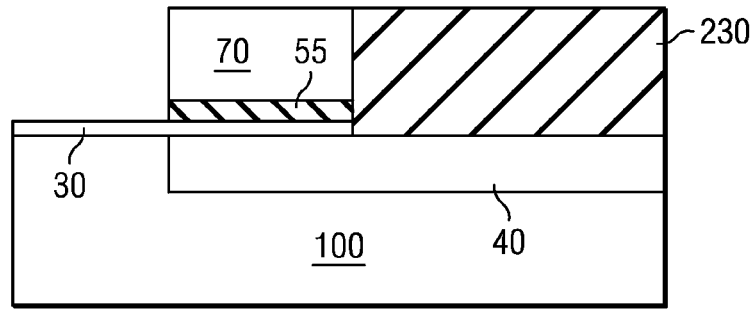
Figure 7D:
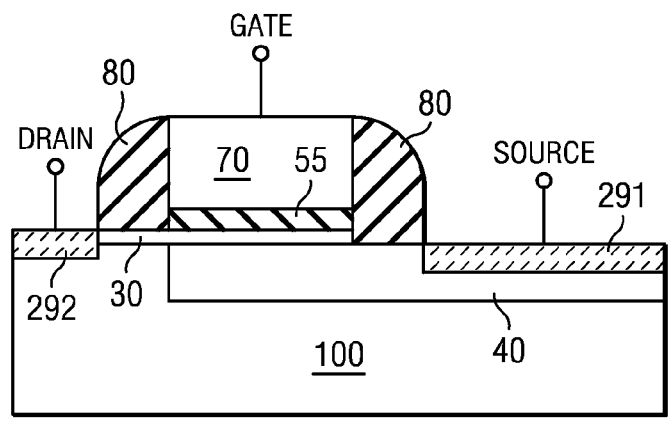

Referring to FIG. 7C, the gate dielectric layer 260 and gate layer 270 are patterned forming the gate dielectric 55 and the gate electrode 70. As next illustrated in FIG. 7D, spacers 80 are formed adjacent the gate electrode 70. In one embodiment, the spacers 80 comprise high-k dielectric materials to increase the gate coupling. The high-k dielectric helps to minimize the resistance of the transistor by increasing the inversion charge under the spacer 80 between the drain (to be formed) and the heavily doped region 40. The exposed heavily doped region 40 and the substrate 100 are silicided forming a source region 291 and a drain region 292. Further processing continues as described in prior embodiments.

Figure 8:
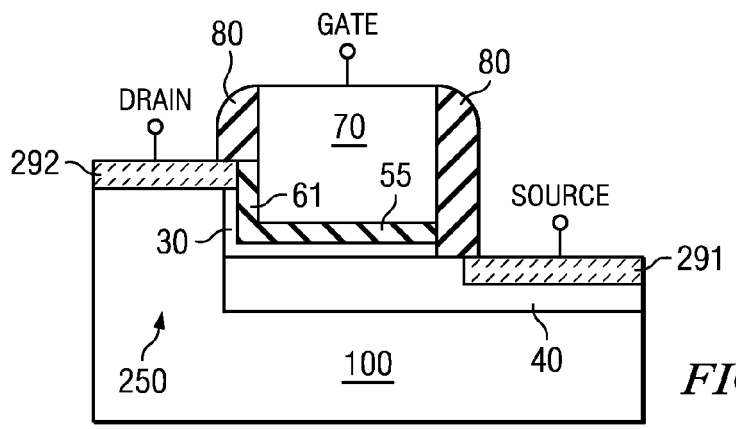
FIG. 8 illustrates an alternative device structure fabricated using the method illustrated in FIG. 7.

FIG. 8 illustrates an alternative device structure fabricated using the method illustrated in FIG. 7.

Referring first to FIG. 8, after patterning the gate dielectric layer 260 and gate layer 270 (FIG. 7C), a gate spacer 61 is formed as a spacer to the gate electrode 70. The gate spacer 61 is about the same thickness as the gate dielectric 55 and comprises about the same material composition as the gate dielectric 55. A second epitaxial process is performed so as to elevate the exposed substrate 100 and form an elevated region 250 and a channel region 30 that is vertical. The elevated region 250 is capacitively coupled to the gate electrode 70 through the gate spacer 61. Subsequent processing follows the steps as described with respect to FIG. 7D. Unlike the transistor of FIG. 7D, in this embodiment, the region under the gate spacer 61 is directly underneath a gate dielectric (gate spacer 61). Thus, this device has much lower resistance due to the formation of a continuous inversion layer in the channel region 30 and in the elevated region 250. The electrons that cross the tunnel junction between the heavily doped region 40 and the channel region 30 do not encounter any resistance in reaching the drain region 292 of the TFET. Advantageously, in this embodiment, the spacers 80 can now be formed as low-k spacers minimizing parasitic coupling with other contacts within the metallization layers.

Figure 9A:
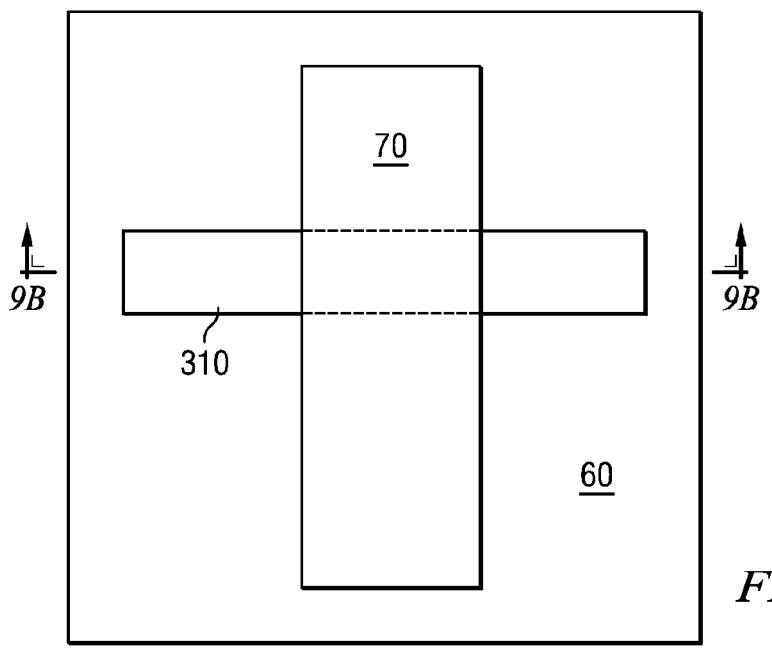
Figure 9B:
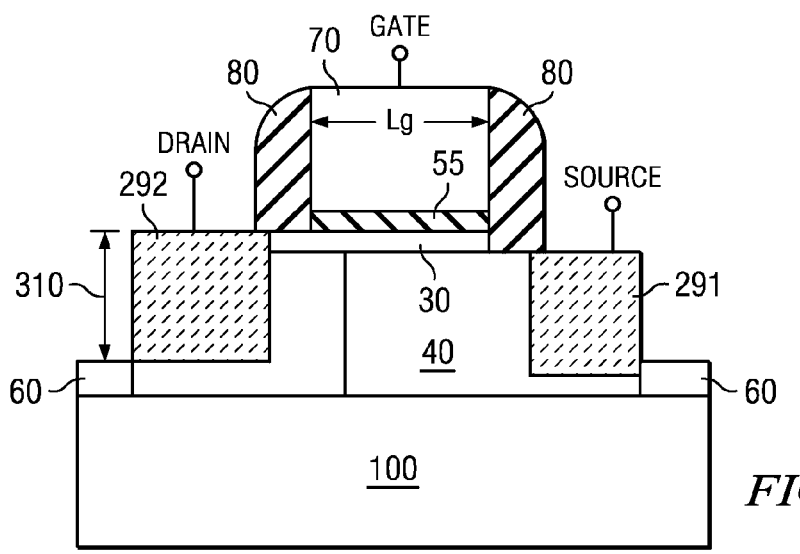

FIG. 9, which includes FIGS. 9A and 9B, illustrates a multiple gate TFET device in accordance with an embodiment of the invention. FIG. 9A illustrates a top view whereas FIG. 9B illustrates a cross-sectional view of a double gate transistor along a fin 310. The multiple gate TFET can be fabricated using the method illustrated in FIG. 7.

Referring to FIG. 9A, a gate electrode 70 wraps around a fin 310 forming the multiple gate TFET. A cross-sectional view of the fin 310 is illustrated in FIG. 9B. The fin comprises the channel region 30 and the heavily doped region 40 forming the tunnel junction. Silicides forming the source region 291 and the drain region 292 are disposed in the fin 310. The channel region 30 is formed epitaxially in all surfaces of the fin 310 facilitating the formation of the tunnel junction around the fin 310. The increased surface area of the tunnel junction 310 increases the drive current of the TFET significantly. Spacers 80 are formed from high-k materials as in the embodiments described with respect to FIG. 7 to decrease resistances within the channel region 30.

FIG. 10, which includes FIGS. 10A-10E, illustrates various stages in the formation of a TFET in accordance with an embodiment of the invention.

Figure 10A:
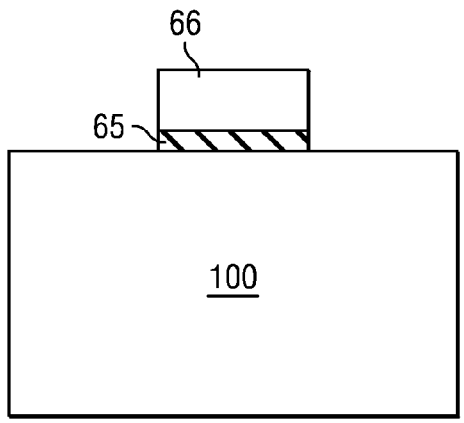
FIGS. 10A-10E, illustrates various stages in the formation of a TFET in accordance with an embodiment of the invention.

Referring to FIG. 10A, a dummy gate dielectric 65, and a dummy gate layer 66 are patterned over a substrate 100. The dummy gate layer 66 is an etch stop layer and comprises a suitable dielectric such as SiN. The dummy gate dielectric 65 comprises a metal or polysilicon that facilitates accurate patterning and easy removal.

Figure 10B:
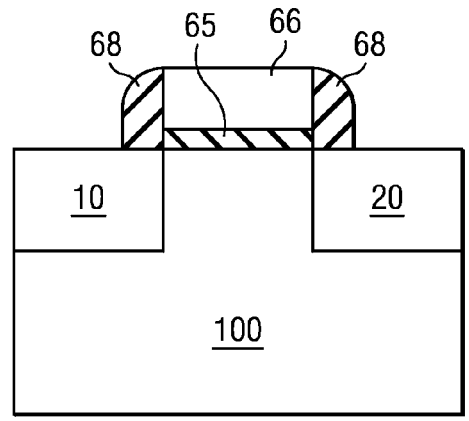

After implanting first and second doped regions 10 and 20, dummy spacers 68 are formed (FIG. 10B). The first doped region 10 comprises a first conductivity type whereas the second doped region 20 comprises an opposite second conductivity type as described in earlier embodiments. The substrate is a first conductivity type in one embodiment.

In some embodiments, the first or the second doped regions 10 or 20 may be formed using an epitaxial process. For example, a recess is formed in the semiconductor body 25 and an epitaxial semiconductor is grown from within the recess. This allows strain to the channel region 30 and the tunnel junction between the channel region 30 and the second doped region 20 or the tunnel junction between the channel region 30 and the heavily doped region 40 so as to increase the tunneling current.

Figure 10C:
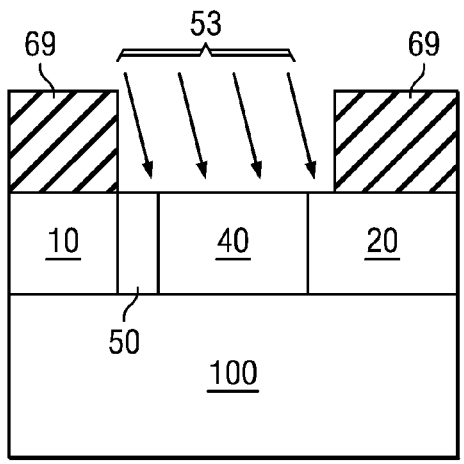

A mask layer 69 is deposited and planarized covering the exposed substrate 100 (FIG. 10C). Using the mask layer 69 as a mask, the dummy gate layer 66, and then dummy gate dielectric 65 are etched and removed. In one embodiment, the dummy spacer 68 is removed, while in some embodiments, the dummy spacer 68 may not be removed and may be used for masking subsequent implantations. An implantation of dopant atoms 53 having a second conductivity type may be performed to form a heavily doped region 40 and a low doped region 50. In various embodiments, the implant does not compensate the higher doped first doped region 10 and instead forms the low doped region 50, thereby separating the first doped region 10 and the heavily doped region 40. In some embodiments, the implant may be performed at an angle, thereby minimizing the compensation of the first doped region 10.

A further implant of a diffusion inhibitor may be performed before or after the dopant atoms 53 are implanted. Examples of diffusion inhibitors include carbon, fluorine, nitrogen, and the like. The diffusion inhibitor will prevent the out-diffusion of dopants from the heavily doped region 40 and into the channel region that will formed subsequently.

An amorphization implant such as silicon or germanium may be performed if necessary to remove the implantation defects. Alternatively, in some embodiments, a sub-amorphization implant may also be used. The sub-amorphization implant is chosen to produce an amorphous region when added to the preexisting damage. In one embodiment, germanium at doses higher than about $1\times10^{14}$ cm$^{-2}$ at energies of about 5 keV to about 30 keV may be used for amorphization. Higher dose implants of germanium, if used appropriately, may also have the beneficial effect of lowering the band gap delta at the tunnel junction being formed (top surface of heavily doped region 40 and channel region to be formed).

Figure 10D:
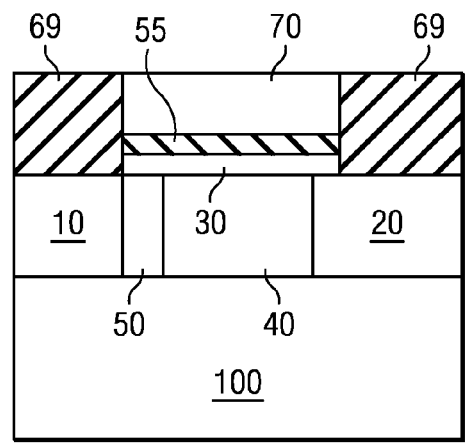

Referring next to FIG. 10D, a channel region 30 is epitaxially grown into the exposed substrate 100. In some embodiments, an implantation of dopant atoms having a first conductivity type may be performed into the channel region 30. Alternatively, the channel region 30 may be in-situ doped during the epitaxial growth process. This helps to form an abrupt junction with the heavily doped region 40. For example, this may be able to overcome any reduction in abruptness arising from the segregation of dopants of the second conductivity type at the channel region 30. For example, when boron is used (as the second conductivity type dopant) to form the heavily doped region 40, during subsequent thermal processing, boron may preferentially segregate into the channel region 30 especially if the channel region 30 comprises a SiGe alloy. In such cases, a slower diffusing dopant of a first conductivity dopant such as arsenic or antinomy may be implanted into the channel region 30 adjacent the junction between the channel region 30 and the heavily doped region 40. As a consequence, the abruptness of the net doping may be tailored to be much sharper than that achievable for an intrinsic channel region 30. In various embodiments, if boron is used as a dopant for the heavily doped region 40, an arsenic implant of about $1\times10^{13}$ cm$^{-2}$ to about $1\times10^{14}$ cm$^{-2}$ at an energy of about 500 eV to about 5 keV may be performed.

Figure 10E:
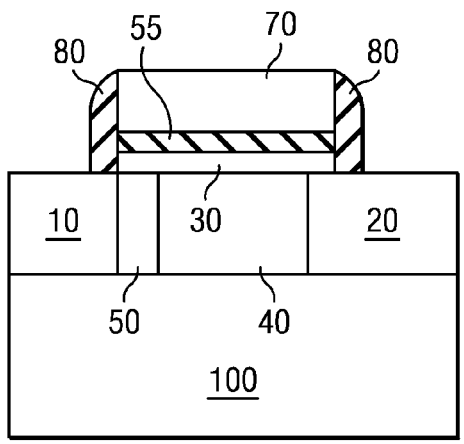

A gate dielectric 55 and a gate electrode 70 are formed over the channel region 30. As illustrated in FIG. 10E, the mask layer 69 is etched and removed and an insulating layer is deposited and anisotropically etched to form the spacers 80.

In some embodiments, a stress liner may be formed over the semiconductor body 25 and the gate electrode 70 to introduce further strain into the channel region 30 and the tunnel junctions.

FIG. 11, which includes FIGS. 11A-11E, illustrates various stages in the formation of a TFET in accordance with an embodiment of the invention.

Figure 11A:
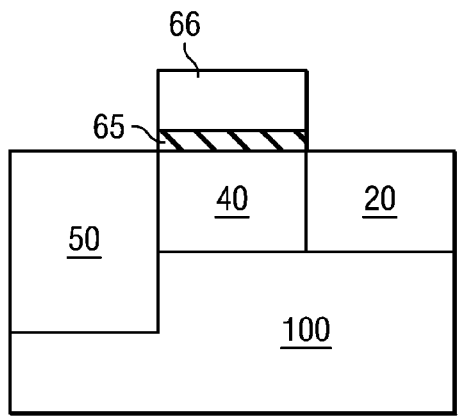
FIGS. 11A-11E, illustrates various stages in the formation of a TFET in accordance with an embodiment of the invention.
Figure 11B:
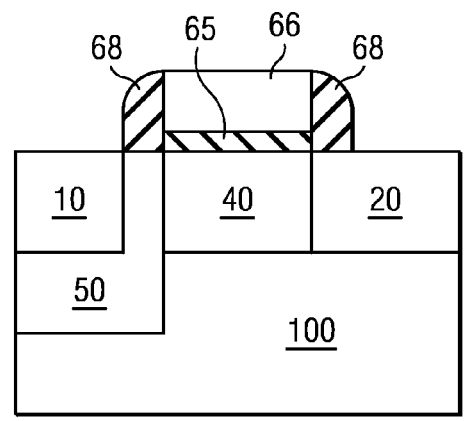

A dummy gate dielectric 65 and a dummy gate layer 66 are patterned over a substrate 100 as described in the prior embodiment (FIG. 11A). Unlike the prior embodiment, prior to forming the dummy gate stack, a heavily doped region 40 is formed. Also, after forming the gate stack, a low doped region 50 is formed adjacent one side of the dummy gate layer 66 while a second doped region 20 is formed adjacent the remaining side of the dummy gate layer 66 (FIG. 11B). After forming dummy spacers 68, a first doped region 10 is implanted.

Figure 11C:
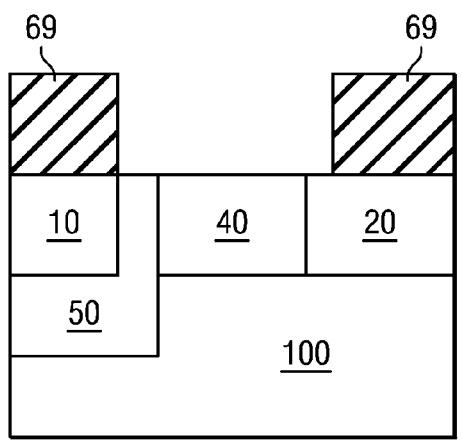
Figure 11D:
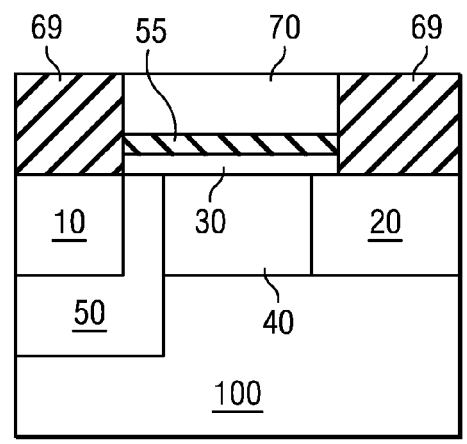
Figure 11E:
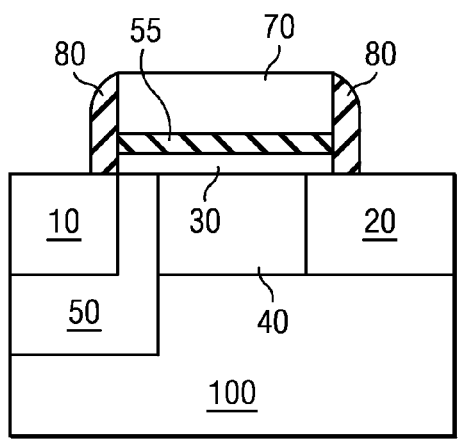

Referring to FIG. 11C, a mask layer 69 is deposited and planarized covering the exposed substrate 100. Using the mask layer 69 as a mask, the dummy gate layer 66 and then dummy gate dielectric 65 are etched and removed. The channel region 30, the gate dielectric 55 and the gate electrode 70 are formed as described in prior embodiments. The channel region 30 may be doped by implantation or in-situ doped as described in prior embodiments. The mask layer 69 is removed and spacers 80 are formed as illustrated in FIG. 11E. Contact formation proceeds as described in prior embodiments.

Alternatively, in some embodiments, unlike the embodiment illustrated in FIG. 11, the heavily doped region 40 is formed after removing the dummy gate layer 66 and dummy gate dielectric 65 according to the process steps described in FIG. 10 (see, e.g., FIG. 10C).

As in prior embodiments, embedded epitaxial regions and/or stress liners may be formed to introduce favorable strain into the channel region 30 and the tunnel junctions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a first drain region of a first conductivity type disposed in a first region of a substrate;
   a first source region of a second conductivity type disposed in said substrate, said second conductivity type being opposite said first conductivity type;
   a first channel region electrically coupled between said first source region and said first drain region, said first source region directly underlying at least a first portion of said first channel region;

a first doped region of the first conductivity type disposed between the first source region and the first drain region, said first doped region contacting the first source region and the first drain region; and a first gate stack overlying said first channel region, wherein the first source region is separated from the first gate stack by the first channel region and the first doped region is separated from the first gate stack by the first channel region, wherein the first source region and the first drain region are heavily doped, wherein the first channel region is lowly doped having the first conductivity type;

a tunnel junction at the intersection between the first source region and the first portion of the first channel region, wherein, the lowly doped first channel region has a lower dopant concentration than a dopant concentration of the heavily doped first source region so that, at the tunnel junction between the first source region and the first channel region, a net doping concentration varies abruptly from the heavily doped second conductivity type first source region to the lowly doped first conductivity type first channel region; and a p/n junction at the intersection between the first source region and the first doped region.

2. The device of claim 1, further comprising a second source region of the second conductivity type disposed in the substrate and adjacent the first channel region.

3. The device of claim 1, wherein the first doped region is doped to a lower dopant concentration than a dopant concentration of the heavily doped first drain region.

4. The device of claim 1, wherein the first channel region comprises a semiconductor material different than a semiconductor material of the first source region.

5. The device of claim 1, wherein the first channel region comprises germanium.

6. The device of claim 5, wherein the germanium content is at least 15% by concentration.

7. The device of claim 1, wherein the first channel region comprises carbon.

8. The device of claim 7, wherein the carbon content is less than about 1%.

9. The device of claim 1, wherein the junction between the first channel region and the first source region is under strain.

10. The device of claim 9, wherein the strain increases a tunnel current at the junction.

11. The device of claim 1, wherein the first source region comprises a crystal orientation that enhances a tunnel current at the junction between the first channel region and the first source region, wherein the crystal orientation of the first source region is different than a crystal orientation within the substrate.

12. The device of claim 1, further comprising:
a second drain region of the second conductivity type disposed in a second region of the substrate;
a second source region of the first conductivity type disposed in said substrate;
a second channel region electrically coupled between said second source region and said second drain region, said second source region underlying a least a portion of said second channel region; and
a second gate stack overlying said second channel region.

13. The device of claim 12, wherein the first channel region and first source region are under a first type of strain, and wherein the second channel region and the second source region are under a second type of strain, wherein the first and the second types of strain are opposite types of strain.

14. The device of claim 1, wherein the first conductivity type is an n-type.

15. The device of claim 1, wherein a gate electrode in the first gate stack controls a tunneling current at the junction between the first channel region and the first source region.

16. The device of claim 1, wherein the first channel region is disposed above a top surface of the first source region and above a top surface of the first drain region.

17. The device of claim 1, wherein the p/n junction is a vertical p/n junction disposed directly below the first channel region.

18. The device of claim 1, wherein the first doped region is disposed under the first channel region.

19. The device of claim 18, wherein the first doped region separates the substrate from the first drain region.

20. The device of claim 18, wherein the substrate contacts the first drain region.

21. The device of claim 18, wherein the first source region contacts a well region of the substrate, and wherein the first source region is disposed between the first doped region and the well region, and wherein a doped trench region of the first conductivity isolates the first source region from an adjacent first source region.

22. The device of claim 18, wherein the first doped region extends further into the substrate than the first source region.

23. The device of claim 1, wherein the first source region contacts at least the first portion of said first channel region along a bottom surface of the first channel region.

24. The device of claim 1, wherein said first doped region directly underlies at least a second portion of said first channel region.

25. A semiconductor device comprising:
a first drain region of a first conductivity type disposed in a first region of a substrate;
a first source region of a second conductivity type disposed in said substrate, said second conductivity type being opposite said first conductivity type;
a second source region of the second conductivity type disposed above the first source region;
a first channel region electrically coupled between said first source region and said first drain region, said first source region directly underlying at least a first portion of said first channel region;
a first doped region of the first conductivity type underlying at least a second portion of said first channel region, said first doped region contacting the first source region and the first drain region;
a first gate stack overlying said first channel region, wherein the first source region is separated from the first gate stack by the first channel region and the first doped region is separated from the first gate stack by the first channel region, wherein the first source region and the first drain region are heavily doped, wherein the first channel region is lowly doped having the first conductivity type;
a tunnel junction at the intersection between the first source region and the first portion of the first channel region, wherein, the lowly doped first channel region has a lower dopant concentration than a dopant concentration of the heavily doped first source region so that, at the tunnel junction between the first source region and the first channel region, a net doping concentration varies abruptly from the heavily doped second conductivity type first source region to the lowly doped first conductivity type first channel region; and a p/n junction at the intersection between the first source region and the first doped region, wherein, in the substrate, the first channel region contacts only the first source region, the first drain region, the first doped region, and the second source region.

26. The device of claim 25, wherein the first doped region is doped to a lower dopant concentration than a dopant concentration of the heavily doped first drain region.

27. The device of claim 25, wherein the first channel region comprises germanium.

28. The device of claim 25, wherein the first channel region comprises carbon.

29. The device of claim 25, wherein the junction between the first channel region and the first source region is under strain so as to increase a tunnel current at the junction.

30. The device of claim 25, wherein the first doped region separates the substrate from the first drain region.

31. The device of claim 25, wherein the p/n junction is a vertical p/n junction.

32. The device of claim 25, wherein the first source region contacts at least the first portion of said first channel region along a bottom surface of the first channel region.

33. A semiconductor device comprising:
a first drain region of a first conductivity type disposed in a first region of a substrate;
a first source region of a second conductivity type disposed in said substrate, said second conductivity type being opposite said first conductivity type;
a second source region of the second conductivity type disposed in said substrate and above the first source region;
a channel region electrically coupled between said first source region and said first drain region and between said second source region and said first drain region, said first source region directly underlying at least a first portion of said channel region, wherein the first source region, the first drain region, the second source region are heavily doped, and the channel region is lowly doped having the first conductivity type; a horizontal tunnel junction is formed between said channel region and said first source region, wherein, at the horizontal tunnel junction between the first source region and the channel region, the lowly doped channel region has a lower dopant concentration than a dopant concentration of the heavily doped first source region so that, a net doping concentration varies abruptly from the heavily doped second conductivity type first source region to the lowly doped first conductivity type channel region; a vertical tunnel junction is formed between said channel region and said second source region, wherein, at the vertical tunnel junction between the second source region and the channel region, a net doping concentration varies abruptly from the heavily doped second conductivity type second source region to the lowly doped first conductivity type channel region, and wherein the vertical tunnel junction is perpendicular to the horizontal tunnel junction;

a doped region of the first conductivity type underlying at least a second portion of said channel region, said doped region contacting the first source region and the first drain region, wherein, in the substrate, the channel region contacts only the first source region, the first drain region, the doped region, and the second source region; and a gate stack overlying said channel region, wherein the first drain region, the first and second source regions, the channel region, the doped region, and the gate stack form a tunnel field effect transistor, wherein the first source region is separated from the gate stack by the channel region and the doped region is separated from the gate stack by the channel region.

34. The device of claim 33, wherein the doped region is doped to a lower dopant concentration than a dopant concentration of the heavily doped first drain region.

35. The device of claim 33, wherein the channel region is silicon-germanium, and wherein the first source region is silicon.

36. The device of claim 33, wherein the tunnel junction between the channel region and the first source region is under strain so as to increase a tunnel current at the tunnel junction.

37. The device of claim 33, wherein the doped region separates the substrate from the first drain region, and wherein the first source region and the doped region form a vertical p-n junction.

38. The device of claim 33, wherein the first source region contacts at least the first portion of said channel region along a bottom surface of the channel region.

* * * * *